United States Patent
Mallikarjunaswamy

(10) Patent No.: US 9,853,143 B2
(45) Date of Patent: Dec. 26, 2017

(54) CLOSED CELL LATERAL MOSFET USING SILICIDE SOURCE AND BODY REGIONS WITH SELF-ALIGNED CONTACTS

(71) Applicant: Alpha and Omega Semiconductor Incorporated, Sunnyvale, CA (US)

(72) Inventor: Shekar Mallikarjunaswamy, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 15/095,426

(22) Filed: Apr. 11, 2016

(65) Prior Publication Data
US 2016/0225898 A1 Aug. 4, 2016

Related U.S. Application Data

(63) Continuation of application No. 14/247,170, filed on Apr. 7, 2014, now Pat. No. 9,337,284.

(51) Int. Cl.
| | |
|---|---|
| *H01L 29/78* | (2006.01) |
| *H01L 29/45* | (2006.01) |
| *H01L 29/06* | (2006.01) |
| *H01L 29/49* | (2006.01) |
| *H01L 29/417* | (2006.01) |
| *H01L 29/66* | (2006.01) |

(Continued)

(52) U.S. Cl.
CPC ........ *H01L 29/7816* (2013.01); *H01L 23/535* (2013.01); *H01L 23/53266* (2013.01); *H01L 29/0634* (2013.01); *H01L 29/0696* (2013.01); *H01L 29/1095* (2013.01); *H01L 29/41758* (2013.01); *H01L 29/456* (2013.01); *H01L 29/4933* (2013.01); *H01L 29/665* (2013.01); *H01L 29/66659* (2013.01); *H01L 29/66674* (2013.01); *H01L 29/66681* (2013.01); *H01L 29/7835* (2013.01); *H01L 21/28052* (2013.01)

(58) Field of Classification Search
CPC .......... H01L 29/7816; H01L 23/53266; H01L 29/66681; H01L 23/535; H01L 29/66659; H01L 29/0634; H01L 29/1095; H01L 29/665; H01L 29/7835; H01L 29/66674; H01L 29/41758; H01L 29/4933; H01L 29/0696; H01L 29/456; H01L 21/28052; H01L 29/7801
USPC .......................... 257/401, 335, 341, 342, 343
See application file for complete search history.

(56) References Cited

U.S. PATENT DOCUMENTS

| | | | | |
|---|---|---|---|---|
| 5,355,008 A | * | 10/1994 | Moyer | ................ H01L 23/4824 257/341 |
| 6,992,353 B1 | * | 1/2006 | Wu | ................... H01L 29/66719 257/335 |

(Continued)

*Primary Examiner* — Shouxiang Hu
(74) *Attorney, Agent, or Firm* — Innovation Counsel LLP

(57) ABSTRACT

A closed cell lateral MOSFET device includes minimally sized source/body contacts formed in source cells with silicided source and body diffusion regions formed therein. In this manner, the cell pitch of the cellular transistor array is kept small while the ruggedness of the transistor is ensured. In other embodiments, a closed cell lateral MOSFET device is formed using silicided source and body diffusion regions and self-aligned contacts or borderless contacts as the source/body contacts. The polysilicon gate mesh can be formed using minimum polysilicon-to-polysilicon spacing to minimize the cell pitch of the cellular transistor array.

11 Claims, 8 Drawing Sheets

(51) Int. Cl.
  *H01L 23/532* (2006.01)
  *H01L 23/535* (2006.01)
  *H01L 29/10* (2006.01)
  *H01L 21/28* (2006.01)

(56) References Cited

U.S. PATENT DOCUMENTS

2004/0108548 A1* 6/2004 Cai ................... H01L 29/1095
                                                        257/335
2009/0261410 A1* 10/2009 Otake ............... H01L 29/41758
                                                        257/342
2012/0299093 A1* 11/2012 Kim ....................... H01L 29/00
                                                        257/335
2013/0115895 A1  5/2013 Crandall
2013/0292763 A1* 11/2013 Chang ................. H01L 29/7816
                                                        257/335

* cited by examiner

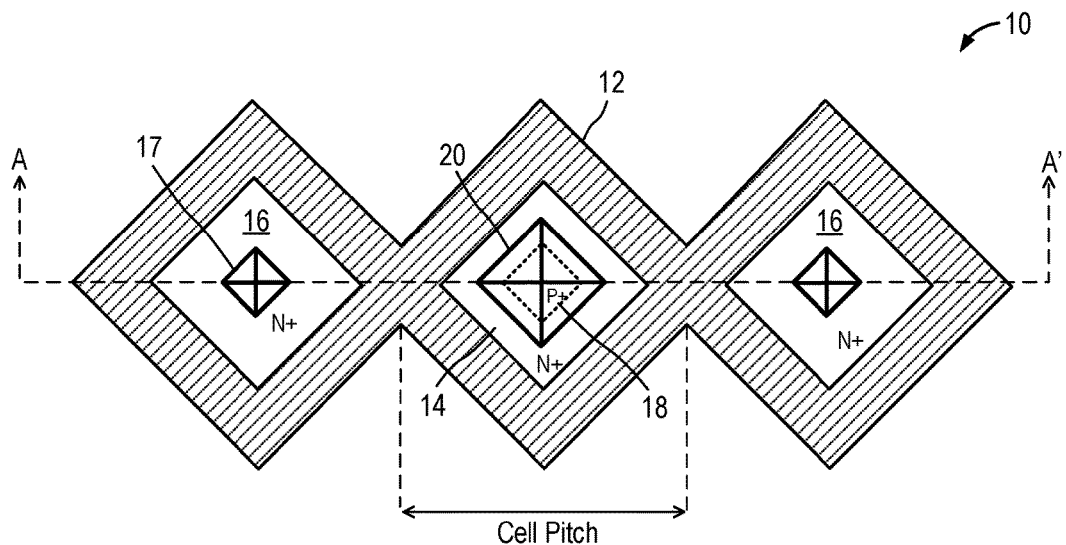
FIG. 2(a)
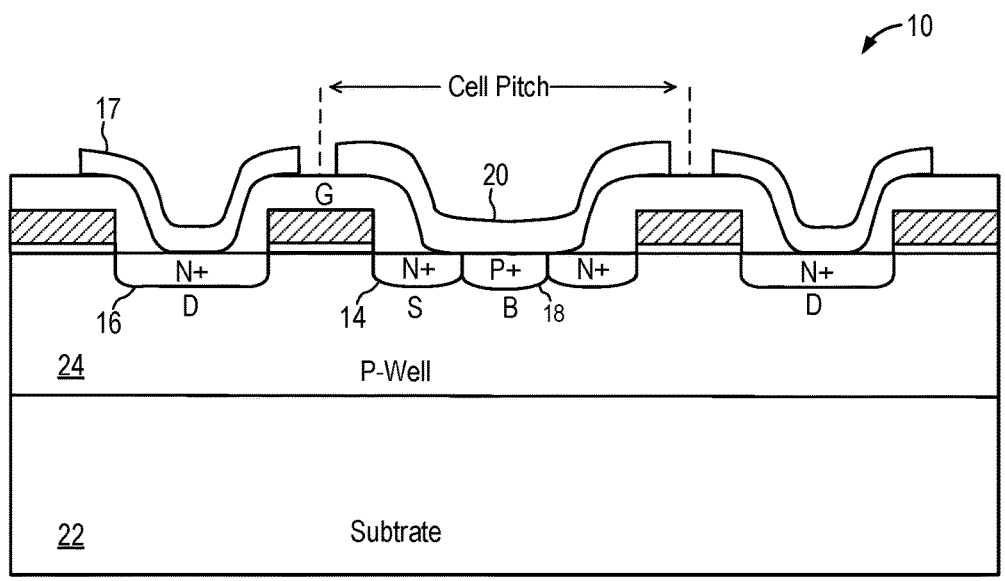
FIG. 2(b)
FIG. 2 (Prior Art)

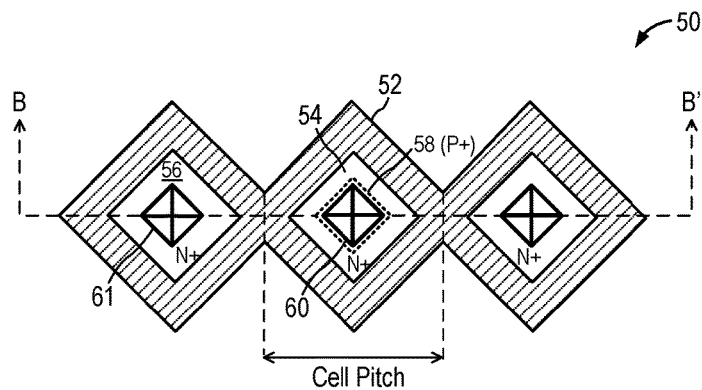
FIG. 3(a)
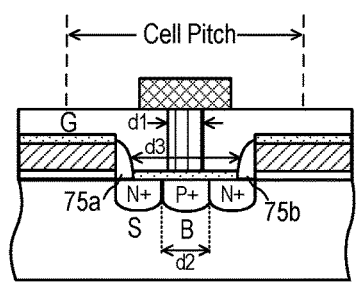
FIG. 3(d)
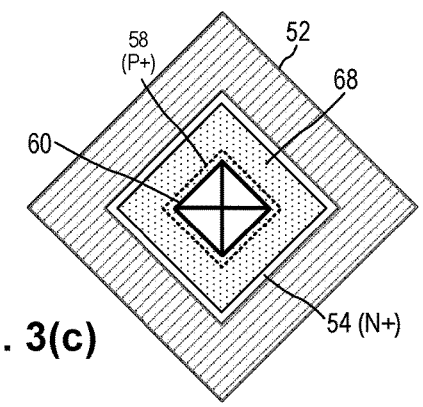
FIG. 3(c)
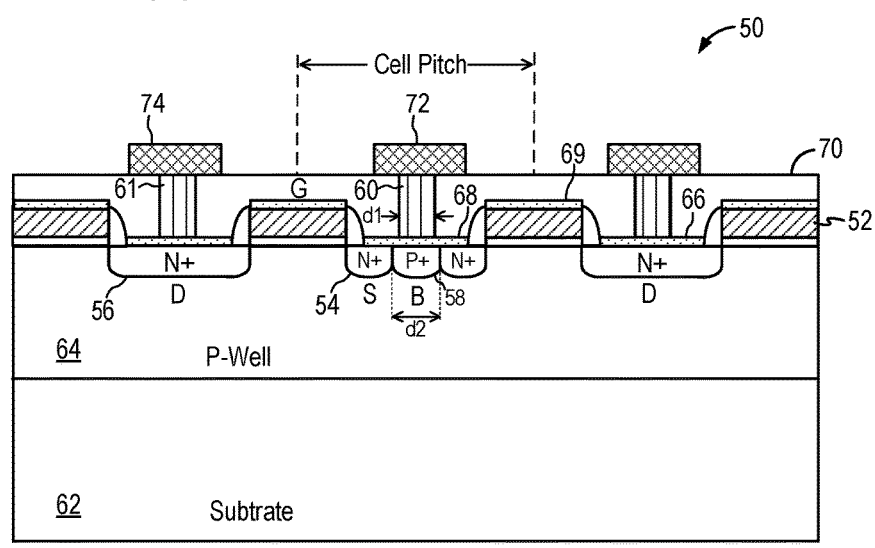
FIG. 3(b)
FIG. 3

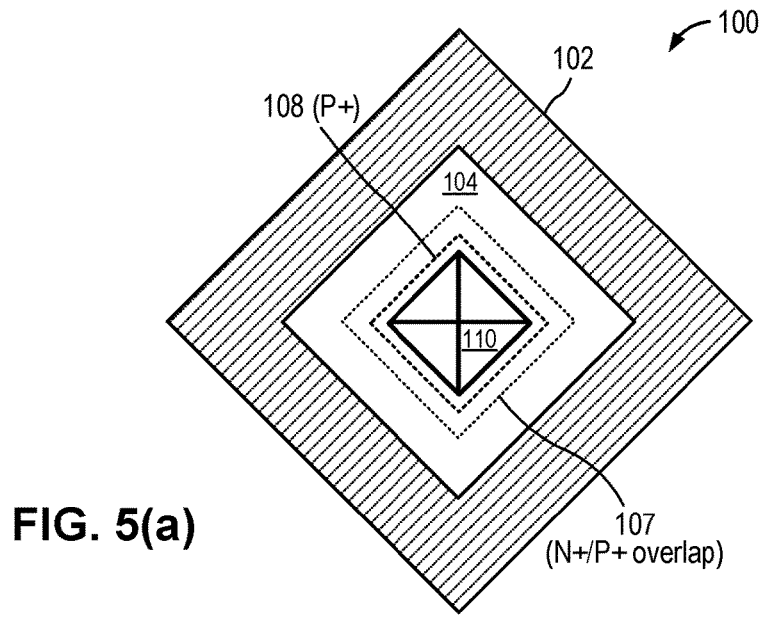
FIG. 5(a)
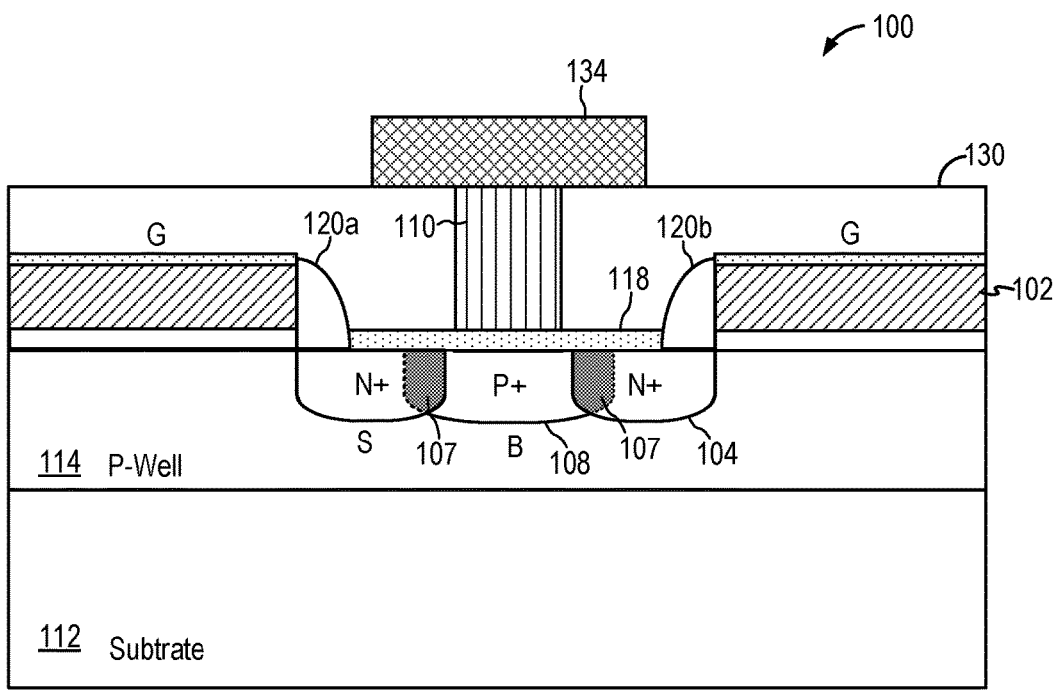
FIG. 5(b)
FIG. 5

FIG. 6(a)
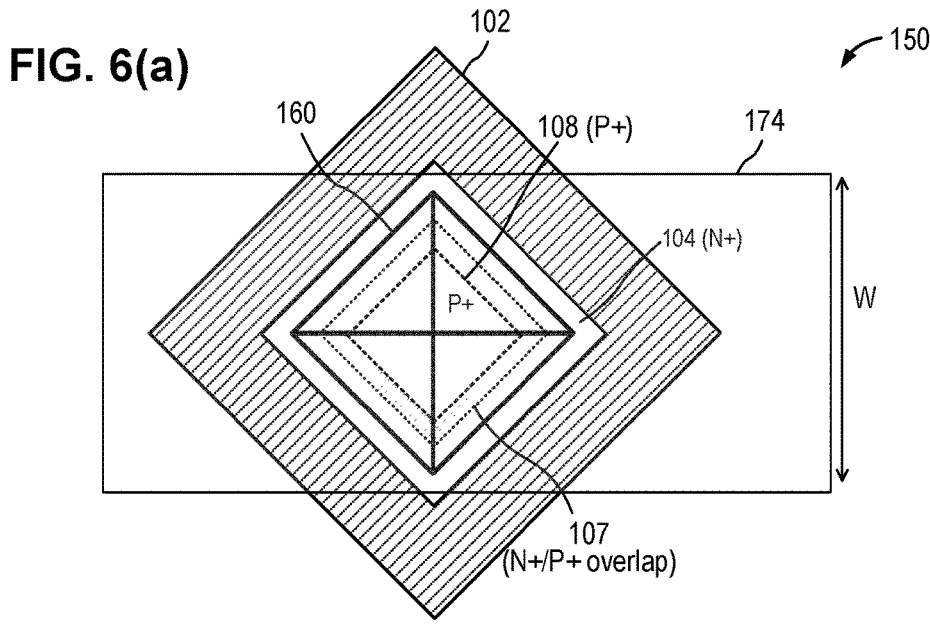
FIG. 6(b)
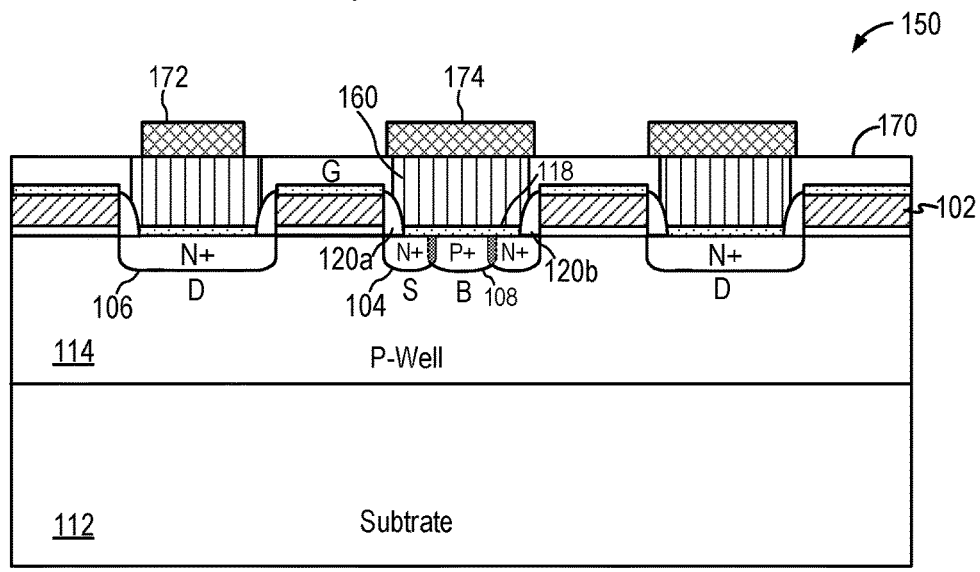
FIG. 6(c)
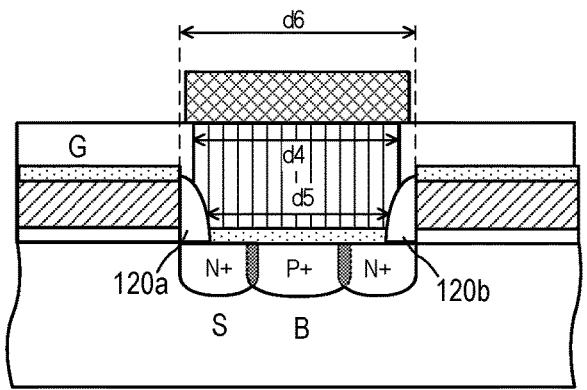
FIG. 6

CLOSED CELL LATERAL MOSFET USING SILICIDE SOURCE AND BODY REGIONS WITH SELF-ALIGNED CONTACTS

CROSS REFERENCE TO OTHER APPLICATIONS

This application is a continuation of co-pending U.S. patent application Ser. No. 14/247,170, entitled CLOSED CELL LATERAL MOSFET USING SILICIDE SOURCE AND BODY REGIONS, filed Apr. 7, 2014, now U.S. Pat. No. 9,337,284, issued May 10, 2016, which is incorporated herein by reference for all purposes.

BACKGROUND OF THE INVENTION

Power metal-oxide-silicon field-effect transistors (MOSFET) are employed in applications requiring high voltages and high currents. Lateral Power MOSFET devices formed using closed cell or cellular array configuration are sometimes preferred because of their increased channel density, that is, an increased channel width per unit of semiconductor area, which results in reduced on-resistance. Low on-resistance MOSFET devices are desirable for their low power loss and ability to conduct high currents.

FIG. 1 duplicates FIG. 1B of U.S. Pat. No. 7,956,384 and illustrates a lateral MOSFET device formed using cellular transistor array implemented with a polysilicon gate mesh in one example. A cellular transistor array structure is also described in U.S. Pat. No. 5,355,008. As shown in FIG. 1, the square cell array increases the channel width per unit area (W/area) by drawing a mesh of polysilicon lines to form alternating source and drain cells that are connected in parallel by metal strips. Furthermore, by forming the openings in the polysilicon mesh to be in a diamond shape, i.e., having a long diagonal and a short diagonal, the source and drain metal strips, arranged in the direction of the short diagonals, can be made wider, thereby reducing the on-resistance of the transistor without increasing the area of the transistor.

In an NMOS lateral MOSFET device, the transistor typically includes a P-well formed in the substrate as the body of the transistor and heavily doped N+ regions formed in the P-well as the source and drain regions. The body of the NMOS transistor is typically electrically shorted to the source of the transistor. To ensure ruggedness of the lateral MOSFET device, a strong electrical connection between the source and the body of the transistor is desired.

FIG. 2, which includes FIGS. 2(a) and 2(b), illustrates the top and cross-sectional views of a conventional closed cell MOSFET device. Referring to FIG. 2(a), a closed cell MOSFET device 10 is formed using a polysilicon gate mesh 12 defining a cellular array of diffusion regions formed in a well. In the present example, the MOSFET device 10 is an NMOS transistor with N+ diffusion regions formed in a P-well where alternating rows of diffusion regions form the source and drain regions of the transistor. For example, N+ diffusion region 14 forms the source region of the transistor (also referred to as the "source cell") while N+ diffusion region 16 form the drain region of the transistor (also referred to as the "drain cell"). In this example, the body connection to the source is provided by a P+ body diffusion region 18 formed inside some or all of the source cells. A butting contact 20 is used to electrically connect to both the N+ source region and the P+ body diffusion region. FIG. 2(b) is a cross-sectional view of the cell array of FIG. 2(a) along the line A-A'. Referring to FIG. 2(b), the butting contact 20 is large in size as the contact needs to overlap both the N+ source diffusion region 14 and the P+ body diffusion region 18 in the source cell. The size of the butting contact 20 is larger than the minimally sized contact 17 used to connect to the drain diffusion region 16. The use of butting contacts to form the source/body connection inside a source cell increases the cell pitch of the cellular transistor array which causes an undesirable increase in the on-resistance value of the transistor.

In cases where increasing the cell pitch is not desired, the source and drain cells may be formed using minimum dimensions and the body contacts are formed outside of the cellular transistor array on the periphery of the transistor device. In this case, it is possible to use the minimum contact-to-polysilicon spacing and minimum metal-to-metal spacing to construct the cellular transistor array. However, contacting the body of the transistor only at the periphery of the cellular transistor array results in reduced ruggedness of the transistor device, especially when fast voltage transients are applied across the drain and source terminals of the transistor. This is because the body of the NMOS lateral transistor forms the base of a parasitic bipolar transistor which can get turned on during a fast transient event, leading to thermal runaway that can eventually cause permanent damage to the transistor device.

BRIEF DESCRIPTION OF THE DRAWINGS

Various embodiments of the invention are disclosed in the following detailed description and the accompanying drawings.

FIG. 2, which includes FIGS. 2(a) and 2(b), illustrates the top and cross-sectional views of a conventional closed cell MOSFET device.

FIG. 3, which includes FIGS. 3(a) to 3(d), illustrates the top and cross-sectional views of a closed cell lateral MOSFET device including source cells incorporating silicided source/body regions in embodiments of the present invention.

FIG. 5, which includes FIGS. 5(a) and 5(b), illustrates the top and cross-sectional views of a closed cell lateral MOSFET device using overlapping source/body regions in alternate embodiments of the present invention.

FIG. 6, which includes FIGS. 6(a) to 6(c), illustrates the top and cross-sectional views of a closed cell lateral MOSFET device using self-aligned contacts in alternate embodiments of the present invention.

DETAILED DESCRIPTION

Figure 1:
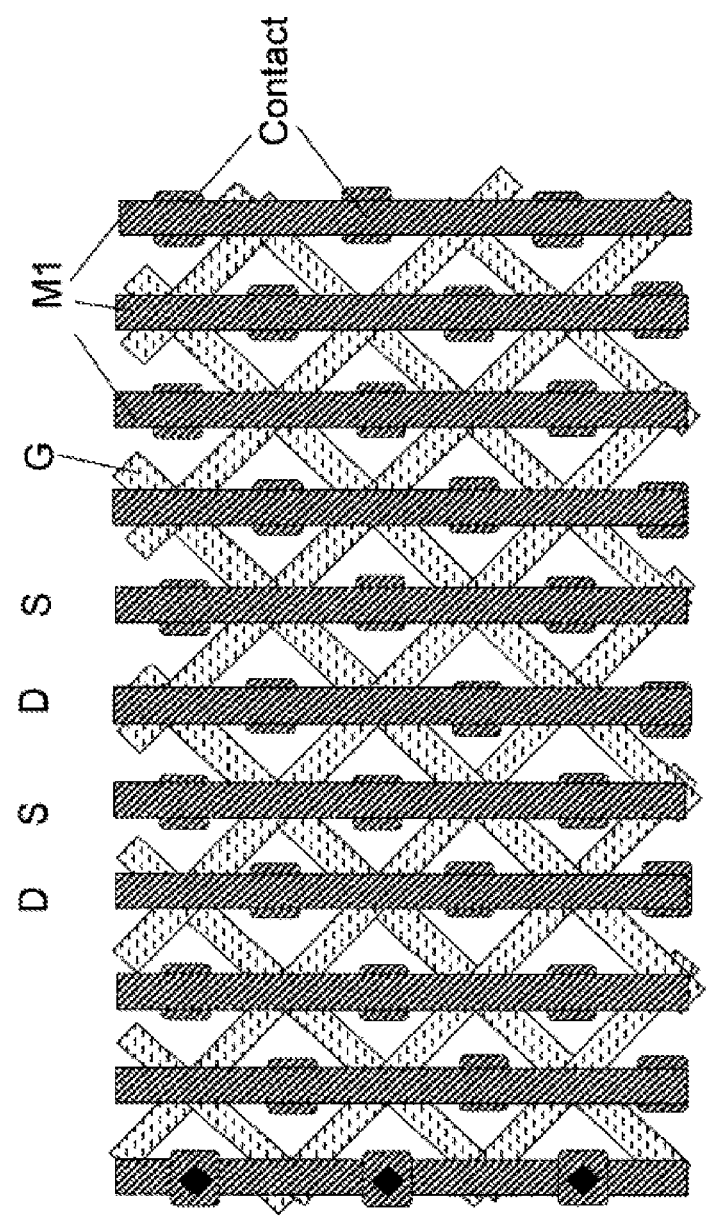
FIG. 1 duplicates FIG. 1B of U.S. Pat. No. 7,956,384 and illustrates a lateral MOSFET device formed using cellular transistor array implemented with a polysilicon gate mesh in one example.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a closed cell lateral metal-oxide-silicon field-effect transistor (MOSFET) device includes minimally sized source/body contacts formed in source cells with silicided source and body diffusion regions formed therein. In this manner, the cell pitch of the cellular transistor array is kept small while the ruggedness of the transistor is ensured. With the use of the silicided diffusion regions in the source cell, the minimally sized source/body contact can be positioned anywhere inside the source cell to make electrical contact to the source and body regions as the metal silicide layer provides the electrical connection between the source and body regions in the source cell. In some embodiments, the minimally sized source/body contact is positioned within the boundary of the silicided body region and the metal silicide layer provides the electrical connection to the source region.

In other embodiments of the present invention, a closed cell lateral MOSFET device is formed using silicided source and body diffusion regions and self-aligned contacts or borderless contacts as the source/body contacts. The polysilicon gate mesh can be formed using minimum polysilicon-to-polysilicon spacing to minimize the cell pitch of the cellular transistor array.

In the present description, "silicided diffusion regions" or "silicided regions" refer to the formation of an electrically conductive metal silicide layer on the exposed top surface of the diffusion regions in a semiconductor device. In the present description, "diffusion regions" refer to heavily doped regions in a semiconductor device which is typically formed using ion implantation of dopants, followed by thermal annealing to diffuse and activate the dopants. In the present description, "source diffusion region" may be referred to as "source region," "drain diffusion region" may be referred to as "drain region," and "body diffusion region" may be referred to as "body region." In the present description, a MOSFET device is sometimes referred to as a MOS transistor, a transistor device, or a transistor.

In some silicide processes, the metal silicide layer may be formed only at the bottom of a contact opening for used to form a metal silicide contact. However, in embodiments of the present invention, the metal silicide layer is formed on the exposed surface of the source and body diffusion regions to form a conductive layer that electrically connects the source and body diffusion regions formed adjacent each other in the source cell of a closed cell MOSFET device. With the source and body diffusion being electrically shorted by the metal silicide layer, a minimally sized contact opening can be used for forming the electrical connection between the source/body diffusion regions and the overlying interconnect structure. The use of a minimally sized source/body contact is possible as the source/body contact does not need to overlay both the source diffusion region and the body diffusion region in the source cell. In fact, the minimally sized source/body contact may be formed to overlay just the body diffusion region and does not overlay any portion of the source diffusion region while the metal silicide layer provides the necessary electrically connection between the source diffusion region and the body diffusion region.

In embodiments of the present invention, the metal silicide layer over the silicide source/body diffusion regions is formed using a silicide process employing a highly conductive refractory metal. Refractory metals commonly employed in silicide processing include platinum (Pt), titanium (Ti), nickel (Ni), and cobalt (Co), each of which forms very low resistively phases with Si, e.g., $PtSi_2$, $TiSi_2$, $NiSi$, and $CoSi_2$. In the silicide process, the refractory metal is deposited on the active region to form an intermetallic compound with silicon but does not react with silicon oxides, nitrides or other dielectrics under the silicide processing conditions. After thermal annealing, the refractory metal layer reacts with the underlying silicon to form the metal silicide layer. Unreacted portions of the refractory metal layer are removed.

In some embodiments, the silicided source and body diffusions are formed using a self-aligned silicide process, referred to as a "salicide" process. The metal silicide layer formed using a self-aligned silicide process is sometimes referred to as a "salicide" layer. In a salicide process, the refractory metal layer may be deposited over the entire surface of the semiconductor device including the exposed surfaces of polysilicon layer and active regions. After thermal annealing and removal of unreacted refractory metal portions, a metal silicide layer is formed on the polysilicon layer to form a silicided polysilicon gate and a metal silicide layer is formed on the active regions to form silicide diffusion regions.

In the present description, a "minimally sized contact" or "minimally sized contact opening" refer to a contact or contact opening that is formed using the minimum sizing parameters specified by the physical layout design rules for the fabrication process used to manufacture the lateral MOSFET device. For example, design rules for a contact may include minimum contact dimension and minimum spacing from contact-to-polysilicon. In some embodiments, the "minimally sized contact" or the "minimally sized contact opening" refers to a contact or an opening that is formed using the minimum contact dimension and the minimum spacing from contact-to-polysilicon as specified by the design rule. However, while the lateral MOSFET device of the present invention enables the use of minimally sized contacts or openings, the lateral MOSFET device of the present invention can be formed using contact sizing that are not absolutely minimally sized. Depending on the application, a larger cell pitch of the cellular transistor array may be tolerated and the lateral MOSFET device may be formed using contact sizing that is not the minimal sizing specified by the design rule. The use of minimally sized contact in the following description is illustrative only and is not intended to be limiting.

Furthermore, in some cases the design rules for contacts to diffusion regions may include a minimum diffusion region overlap of the contact opening. The minimum diffusion region overlap design rule is provided to ensure that a contact opening formed over a diffusion region will be formed within the boundary of the diffusion region. However, with the use of the silicide source/body diffusion regions in the lateral MOSFET device of the present invention, the source/body contact can be formed without regard to the minimum diffusion region overlap design rule as the source/body contact is not formed directly over the diffusion region but rather is formed over a metal silicide layer.

FIG. 3, which includes FIGS. 3(a) to 3(d), illustrates the top and cross-sectional views of a closed cell lateral MOSFET device including source cells incorporating silicided source/body regions in embodiments of the present invention. In particular, FIG. 3(a) illustrates a portion of the cellular transistor array of the lateral MOSFET device, FIG. 3(b) illustrates the cross-sectional view of the portion of the cellular transistor array across a line B-B', FIG. 3(c) illustrates an expanded top view of one source cell in the cellular transistor array, FIG. 3(d) illustrates an expanded cross-section view of a source cell. Referring to FIGS. 3(a) to 3(d), a closed cell lateral MOSFET device 50 (or "transistor 50") is formed using a polysilicon gate mesh 52 defining a cellular array of diffusion regions formed in a semiconductor layer. The semiconductor layer may include well regions formed therein as the body of the transistor. The diffusion regions and the body of the transistor have opposite conductivity types. The polysilicon gate mesh 52 may define square cells or diamond shaped cells. In the present embodiment, the lateral MOSFET device 50 is an NMOS transistor with N+ source/drain regions 54, 56 formed in a P-well 64 as the body of the transistor. The P-well 64 is lightly doped in comparison with the N+ source/drain regions.

In some embodiments, the semiconductor layer may include a semiconductor substrate 62 and an epitaxial layer formed on the substrate 62. In some embodiments, P-well 64 may be formed in the substrate 62 or in the epitaxial layer formed on the substrate 62. In other embodiments, the body of the transistor may be formed in the semiconductor layer being lightly doped with a conductivity type opposite to the source/drain diffusion regions. The use of well regions as the body of the transistor is optional. The exact structure of the semiconductor layer is not critical to the practice of the present invention.

In the cellular transistor array, alternating rows of diffusion regions form the source regions and drain regions of the transistor. More specifically, N+ diffusion region 54 form the source region of the transistor 50 (also referred to as the "source cell") while N+ diffusion region 56 form the drain region of the transistor 50 (also referred to as the "drain cell"). To form the electrical connection between the source and the body of the transistor, a P+ body diffusion region 58 is formed inside some or all of the source cells. The P+ body diffusion region 58 is a heavily doped diffusion region having the same conductivity as the body of the transistor to provide an ohmic contact to the body of the transistor. In the present embodiment, the body of the transistor is the P-well 64 and heavily doped P+ body diffusion region 58 is used to provide an ohmic contact to P-well 64. In the cellular transistor array, the P+ body diffusion region 58 is typically formed in the center of a source cell encircled by the source diffusion region 54. The source diffusion region 54 is formed abutting the channel formed under the polysilicon gate mesh 52.

In embodiments of the present invention, a metal silicide layer 68 is formed on the exposed silicon surface of the N+ source diffusion region 54 and the P+ body diffusion region 58, effectively electrically shorting the N+ and P+ regions. In the present example, a salicide process is used and a metal silicide layer is also formed on the exposed silicon surface of the N+ drain diffusion region 56 and the exposed top surface of the polysilicon layer 52. In the salicide process, spacers formed along the sidewalls of the polysilicon gate structure prevent the metal silicide layer formed on the polysilicon layer 52 from being electrically shorted to the metal silicide layer formed on the active regions (diffusion regions 54, 56). Accordingly, a metal silicide layer 68 is formed over the source and body diffusion regions 54, 58, a metal silicide layer 66 is formed over the drain diffusion region 56, and a metal silicide layer 69 is formed over the polysilicon layer 52. Note that the metal silicide layers are omitted in the top view of FIG. 3(a) to simplify the figure. It is understood that a metal silicide layer covers the source and body diffusion regions within the source cell, another metal silicide layer covers the drain diffusion region in the drain cell and another metal silicide layer is formed over the polysilicon gate mesh.

With the metal silicide layer 68 thus formed, the source region 54 and the body region 58 are electrically shorted. Source/body electrical connection to overlying interconnect structure can be made using a contact opening that is smaller than the source diffusion region 54 or the body diffusion region 58. In particular, when a small cell pitch is desired, the source/body contact can be formed using minimum contact size dimension. Furthermore, the source/body contact can be formed in the center of the source cell for symmetry and to enable the use of minimum contact-to-polysilicon spacing on all sides of the contact. In some embodiments of the present invention, a source/body contact 60 is formed positioned over the P+ body diffusion region 58 and is electrically connected to the metal silicide layer 68, as shown in FIG. 3(c). In one embodiment, the source/body contact 60 is formed in an opening having a dimension d1 that is about equal to or smaller than the dimension d2 of the P+ body diffusion region 58. Accordingly, even though the source/body contact 60 does not overlap the N+ source diffusion region 54, electrical connection to the source region is realized through the metal silicide layer 68.

In embodiments of the present invention, the silicide layer 68 is formed on the entire exposed silicon surface in the source cell between adjacent spacers 75a, 75b formed along the sidewalls of the polysilicon gate 52 (FIG. 3(d)). The source/body contact 60 is formed in an opening having a dimension d1 that is smaller than the dimension d3 between the adjacent spacers 75a, 75b. Furthermore, the sidewalls of the contact opening are spaced apart from the spacers 75a, 75b.

In the present embodiment, the lateral MOSFET device 50 uses a contact plug structure as the interconnect structure connecting the diffusion regions to the overlying metal layer. After the metal silicide formation, an insulating dielectric layer 70 is formed over the semiconductor structure. Contact openings are formed in the dielectric layer 70 to expose the metal silicide layer 68 above the P+ body diffusion region 58 and also to expose the metal silicide layer 66 above the N+ drain region 56. The contact openings are then filled with a metal layer, such as tungsten. A tungsten plug contact thus formed in the source cell over the metal silicide layer 68 becomes the source/body contact 60. A tungsten plug contact thus formed in the drain cell over the metal silicide layer 66 becomes the drain contact 61. With the contact plug structure thus formed, a metal layer can then be formed over contact plugs to connect the drain cells and to connect the source cells. For example, a metal layer may be deposited and patterned to form a first metal line 72 connecting to the source cells and a second metal line 74 connecting to the drain cells.

In the above described embodiments, the source/body contact 60 is formed in the center of the source cell which enables the use of the minimum contact-to-poly spacing to form a cell array with minimum cell pitch. In other embodiments, the source/body contact 60 may be positioned anywhere within the source cell and does not have to be positioned in the center of the source cell. For example, in some applications, the cell pitch may be relaxed and the source cell may be formed with a larger area such that the source/body contact may be formed in a source cell while meeting the minimum contact-to-poly spacing at only some portions of the contact with other portions of the contact having greater than minimum contact-to-poly spacing.

In the above described embodiments, an NMOS closed cell lateral MOSFET device is described. In other embodiments, a PMOS closed cell lateral MOSFET device can be formed using the silicided source/body diffusion regions and minimally sized source/body contacts as described above. In that case, the source and drain diffusion regions are P+ diffusion regions while the body diffusion region is N+ diffusion region.

Figure 4:
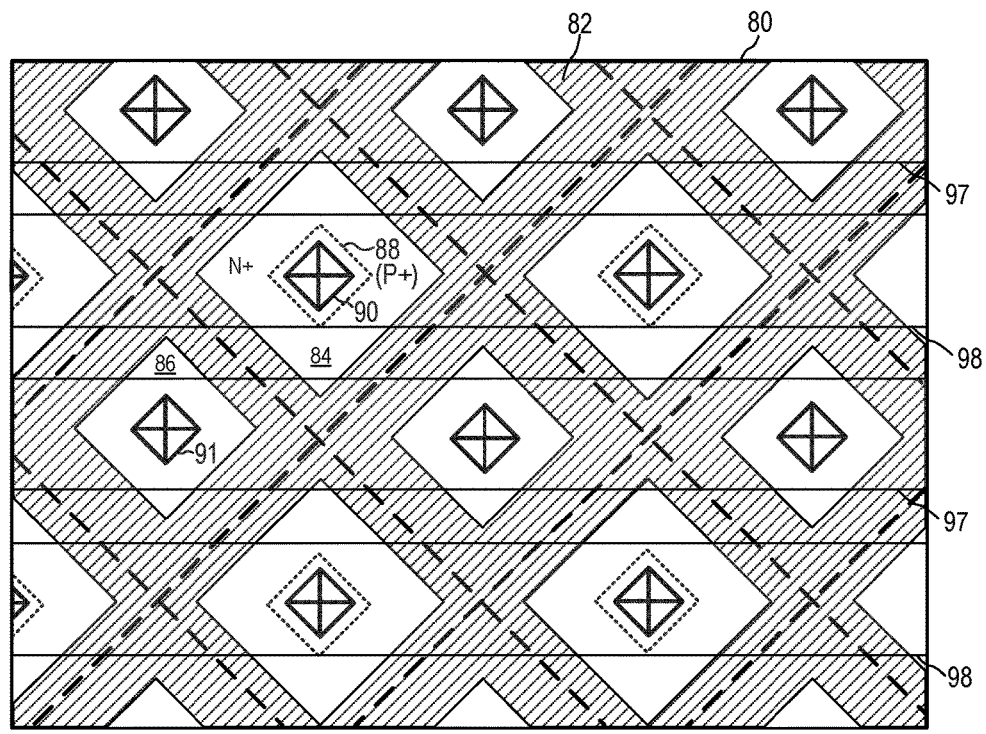
FIG. 4 is a top view of a closed cell lateral MOSFET device including source cells incorporating silicided source/body regions in alternate embodiments of the present invention.

FIG. 4 is a top view of a closed cell lateral MOSFET device including source cells incorporating silicided source/body regions in alternate embodiments of the present invention. Referring to FIG. 4, a closed cell lateral MOSFET device 80 is formed using a polysilicon gate mesh 82 defining a cellular array of alternating rows of source diffusion regions 84 and drain diffusion regions 86 formed in a well. Body diffusion regions 88 are formed within source cells and, in particular, are formed in the center of the source cell. A metal silicide layer (not shown) is formed in the source cell to electrically connect the source and body diffusion regions. In other embodiments, metal silicide layers (not shown) are also formed in the drain cells and over the polysilicon gate. Minimally sized contacts are formed in the source cells and the drain cells to make electrical connection to the source and drain of the transistor 80. In some embodiments, the contacts are formed as contact plugs, such as tungsten plug contacts. For example, drain contacts 91 are formed in the drain cells and source/body contacts 90 are formed in the source cells. Importantly, the source/body contacts 90 can be formed using minimum contact dimension and minimum contact-to-polysilicon spacing. In the present example, the source/body contact 90 is formed within the boundary of the body diffusion region 88. Metal lines 97 can be formed over the semiconductor structure to connect to the drain contacts 91 and metal lines 98 can be formed over the semiconductor structure to connect to the source/body contacts 90.

Closed cell lateral MOSFET device 80 is the preferred structure for power MOSFET devices as the cellular transistor array increases the effective gate width and the source/drain area of the transistor. In the closed cell lateral MOSFET device 80, the channel width of the transistor can be further extended at the source side by increasing the periphery length of the source cells. To preserve the square cell symmetry and to preserve the channel length (between the source and drain region), the periphery length of the drain cell is shortened, as shown in FIG. 4. In this manner, the channel width is wider at the source while the channel length remains the same. Increasing the channel width at the source side of the lateral MOSFET transistor 80 results in increased current carrying capacity of the transistor.

FIG. 5, which includes FIGS. 5(a) and 5(b), illustrates the top and cross-sectional views of a closed cell lateral MOSFET device using overlapping source/body regions in alternate embodiments of the present invention. In particular, FIG. 5(a) illustrates an expanded view of one source cell in the cellular transistor array and FIG. 5 (b) illustrates the cross-sectional view of the source cell. More specifically, FIG. 5 illustrates an alternate method and structure for forming the source diffusion region and the body diffusion region in the source cell. Therefore, FIGS. 5(a) and 5(b) illustrate only the source cell of the lateral MOSFET device.

Referring to FIGS. 5(a) to 5(b), a closed cell lateral MOSFET device 100 (or "transistor 100") is formed using a polysilicon gate mesh 102 defining a cellular array of diffusion regions formed in a well. In the present embodiment, the lateral MOSFET device 100 is an NMOS transistor with N+ source diffusion region 104 formed in a P-well 114 formed on a semiconductor substrate 112. P+ body diffusion region 108 is formed in the source cell encircled by the N+ source diffusion region 104. In the cellular transistor array, alternating rows of diffusion regions form the source regions and drain regions of the transistor. The drain regions are omitted in FIG. 5 for simplicity.

In the source cell of lateral MOSFET device 100, the N+ source diffusion region 104 and the P+ body diffusion region 108 are formed as overlapping diffusion regions. In one embodiment, the overlapping diffusion regions can be formed by using an N+ implant mask and a P+ implant mask that overlap in each source cell. For example, the P+ implant mask can be drawn to a wider boundary so as to overlap with the N+ implant mask in the source cell. When the P+ and N+ implantation processes are completed, an overlapped region 107 is formed with N+ and P+ dopants. However, because N+ dopants dominate over P+ dopants, after thermal annealing, the overlapped region 107 will be converted to an N-type area so that the N+ source region 104 is extended to include the overlapped region 107 and the P+ body diffusion region 108 is narrowed.

Subsequent to the source, drain and body diffusion region formation, a metal silicide layer 118 is formed on the exposed silicon surface of the N+ source diffusion region 104 and the P+ body diffusion region 108, effectively electrically shorting the N+ and P+ regions. Note that the metal silicide layer 118 is omitted in the top view of FIG. 5(a) to simplify the figure. It is understood that a metal silicide layer covers the source and body diffusion regions within the source cell and another metal silicide layer may cover the polysilicon gate mesh. With the metal silicide layer 118 thus formed, source/body electrical connection to overlying interconnect structure is made by forming a source/body contact 110 in the source cell. In the present embodiment, the source/body contact 110 is centered in the source cell and positioned over the P+ body diffusion region 108. The source/body contact 110 is electrically connected to the metal silicide layer 118, as shown in FIG. 5(b). The use of overlapping source and body diffusion regions enables further reduction of the cell pitch of the cellular transistor array.

In embodiments of the present invention, the silicide layer 118 is formed on the entire exposed silicon surface in the source cell between adjacent spacers 120a, 120b formed along the sidewalls of the polysilicon gate 102. The source/body contact 110 is formed in an opening having a dimension that is smaller than the distance between the adjacent spacers 120a, 120b. Furthermore, the sidewalls of the contact opening are spaced apart from the spacers 120a, 120b.

In the present embodiment, source/body contact 110 is a contact plug, such as a tungsten plug contact, formed in a dielectric layer 130. A metal line 134 may be formed above the source/body contact 110 to form the source/body connection.

FIG. 6, which includes FIGS. 6(a) to 6(c), illustrates the top and cross-sectional views of a closed cell lateral MOSFET device using self-aligned contacts in alternate embodiments of the present invention. The closed cell lateral MOSFET device 150 in FIG. 6 is constructed in the same manner as the MOSFET device 100 of FIG. 5 except for the use of self-aligned contacts, also referred to as "borderless contacts." Like elements in FIG. 5 and FIG. 6 are given like reference numerals to simplify the discussions. In FIG. 6, the source diffusion region 104 and body diffusion region 108 are formed as overlapping diffusion regions as in MOSFET device 100 of FIG. 5. In other embodiments, the source diffusion region and body diffusion region can be formed as adjacent diffusion regions as in FIG. 3(b). Note that the metal silicide layer is omitted in the top view of FIG. 6(a) to simplify the figure.

Referring to FIG. 6, with the metal silicide layer 118 thus formed over the source and body diffusion regions 104, 108 in the source cell, a self-aligned contact process can be used to form the contact structure for electrically connecting the source/body regions to the metal lines above. The use of self-aligned contacts enables the use of minimally sized polysilicon spacing to reduce the cell pitch of the cellular transistor array. More specifically, the polysilicon gate electrode 102 can be formed using minimum polysilicon-to-polysilicon spacing. Spacer structures are formed on the sidewalls of the polysilicon gate 102. Then contact openings are formed which overlaps the spacer structures. A metal layer, such as tungsten, fills the contact openings to form the self-aligned contact, such as source/body contact 160. As thus formed, the source/body contact 160 covers substantially the entire area of the source cell and is isolated from the polysilicon gate by the spacer structures.

In embodiments of the present invention, the silicide layer 118 is formed on the entire exposed silicon surface in the source cell between adjacent spacers 120a, 120b formed along the sidewalls of the polysilicon gate 102. The source/body contact 160 is formed in an opening in the dielectric layer 170 having a dimension d4 that is larger than the smallest distance d5 between the adjacent spacers 120a, 120b but smaller than the distance d6 between adjacent gate structures 102 (refer to FIG. 6(c)). Furthermore, in some embodiment, the sidewalls of the contact opening of contact 160 intersect the spacers 120a, 120b at a point lower than half of the height of the spacer. The adjacent spacers 120a, 120b therefore define the bottom portion of the contact opening of source/body contact 160.

Figure 7:
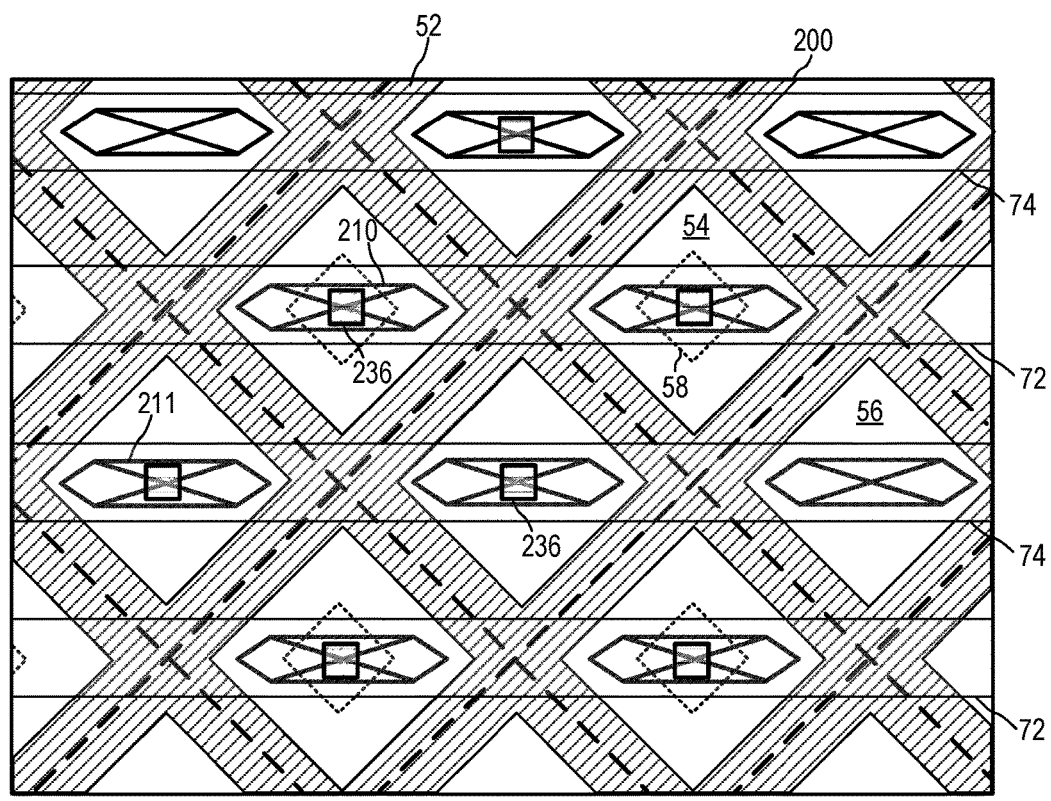
FIG. 7 is a top view of a closed cell lateral MOSFET device including source cells incorporating self-aligned contacts in alternate embodiments of the present invention.

When self-aligned contacts 160 are used, the metal line 174 formed over the contacts may have a wide width W. In some cases, metal-to-metal minimum spacing prevents the use of wide metal lines 174. In that case, the source/body contacts may be formed using a pattern to minimize the width of the overlying metal line. FIG. 7 is a top view of a closed cell lateral MOSFET device including source cells incorporating self-aligned contacts in alternate embodiments of the present invention.

Referring to FIG. 7, a closed cell lateral MOSFET device 200 in FIG. 7 is constructed in the same manner as the MOSFET device 50 of FIG. 3 except for the use of self-aligned contacts. Like elements in FIG. 3 and FIG. 7 are given like reference numerals to simplify the discussions. In FIG. 7, the source diffusion region 104 and body diffusion region 108 are formed as adjacent diffusion regions as in FIG. 3(b). In other embodiments, the source diffusion region and body diffusion region can be formed as overlapping diffusion regions as in MOSFET device 100 of FIG. 5. A metal silicide layer (not shown) is formed in the source cell to electrically short the source and body diffusion regions.

In closed cell lateral MOSFET device 200, the source/body contacts 210 and the drain contacts 211 are formed as narrowed self-aligned stripe contacts. In the narrowed self-aligned stripe contact, the contact has an elongated shape with the ends of the contact being self-aligned to the spacers formed along the sidewall of the polysilicon gate layer 52. The width of the contact 210, 211 is narrowed so that the metal lines 72 and 74 overlying the respective contacts 210, 211 can be narrowed to meet the minimum metal-to-metal spacing requirement of the fabrication process. In the present illustration, stacked vias 236 may be used to connect the metal lines 72, 74 to an overlying metal layer, such as the second metal layer of the MOSFET device.

Figure 8:
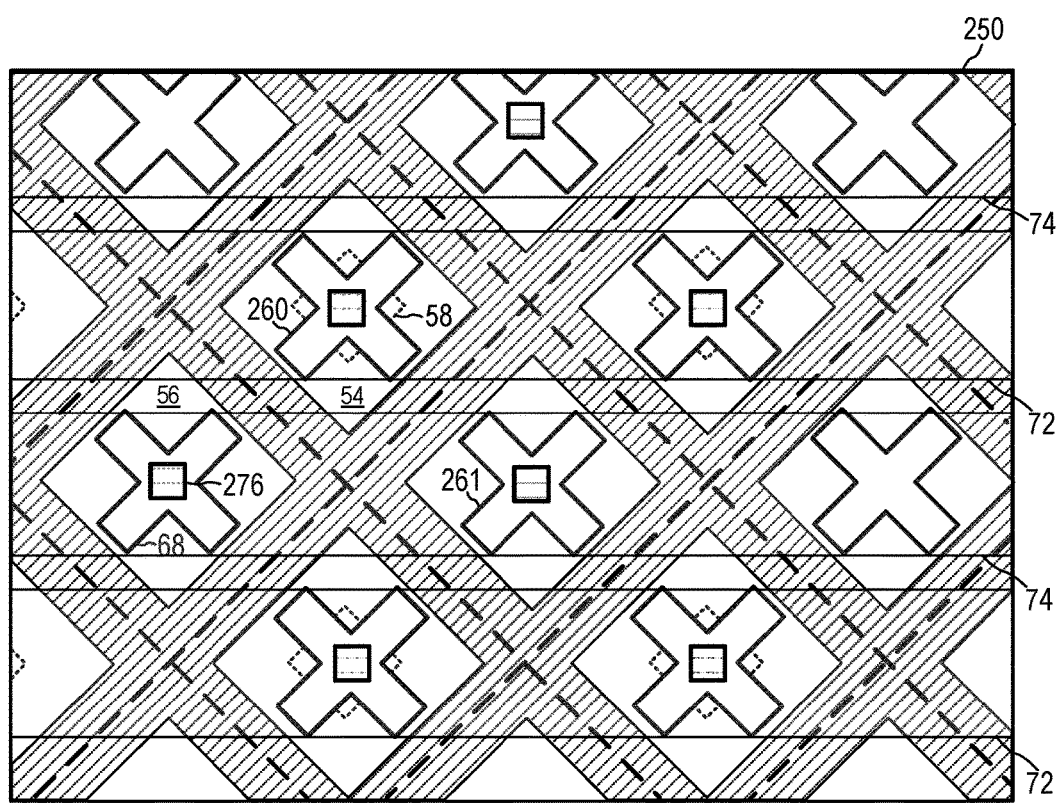
FIG. 8 is a top view of a closed cell lateral MOSFET device including source cells incorporating self-aligned contacts in alternate embodiments of the present invention.

In other embodiments of the present invention, the self-aligned source/body contacts can be formed using other suitable shape and the source/body contacts can be formed with only a portion of the contact being self-aligned. The shape of the contact is not limited by the need to contact the source and body diffusion regions as the two regions are shorted by the metal silicide layer. The use of a stripe contact in FIG. 7 is illustrative only and is not intended to be limiting. FIG. 8 is a top view of a closed cell lateral MOSFET device including source cells incorporating self-aligned contacts in alternate embodiments of the present invention. Referring to FIG. 8, a closed cell lateral MOSFET device 250 is formed in substantially the same manner as the MOSFET device 200 in FIG. 7. A metal silicide layer (not shown) is formed in the source cell to electrically short the source and body diffusion regions. However, in FIG. 8, the source/body contact 260 and the drain contact 261 are formed in a cross-shape with the ends of the cross being self-aligned to the spacer structure of the polysilicon gate. Metal lines 72 and 74 connect to the source/body contacts and drain contacts respectively. Stack vias 276 can be formed on the contacts 260, 261 for making electrical connection to an overlying metal layer.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A closed cell lateral MOS transistor, comprising:
   a semiconductor layer of a first conductivity type forming the body of the transistor, the semiconductor layer being lightly doped;
   a conductive gate overlying and insulated from a top surface of the semiconductor layer by a gate dielectric layer, the conductive gate forming a mesh having a plurality of openings, the plurality of openings defining a cellular array of source cells and drain cells;
   sidewall spacers being formed on sidewalls of the conductive gate;
   a plurality of diffusion regions of a second conductivity type, opposite the first conductivity type, formed in the semiconductor layer exposed by the openings in the mesh, the plurality of diffusion regions forming the cellular array of source cells and drain cells, wherein alternating rows of the diffusion regions form source regions and drain regions of the transistor, and the semiconductor layer under the conductive gate between the source regions and the drain regions forms the channel of the transistor;

a body diffusion region of the first conductivity type formed in each of the source cells in the cellular array of source and drain cells, the body diffusion region being more heavily doped than the semiconductor layer and being encircled by the source region in each of the source cells;

a metal silicide layer formed on a top surface of the plurality of diffusion regions and the body diffusion regions, the metal silicide layer being formed in the source cells to electrically connect the source region and the body diffusion region formed in each of the source cells;

a dielectric layer formed over the semiconductor layer, the conductive gate and the sidewall spacers, the dielectric layer including a plurality of contact openings exposing at least the source cells, each contact opening being formed in a respective source cell to expose at least a portion of the source region and at least a portion of the body region formed in the respective source cell, and at least one sidewall of the contact opening overlapping the sidewall spacer formed on at least one sidewall of the conductive gate to expose a lower portion of the sidewall spacer; and a source/body contact formed in the contact opening of each of the source cells and in contact with the metal silicide layer, the source/body contact being electrically connected to the source region and the body diffusion region in each of the source cells through the metal silicide layer, the source/body contact being isolated from the conductive gate by the sidewall spacers.

2. The closed cell lateral MOS transistor of claim 1, wherein the semiconductor layer comprises a well of the first conductivity type formed on a semiconductor substrate, the well forming the body of the transistor.

3. The closed cell lateral MOS transistor of claim 1, wherein the semiconductor layer comprises a well of the first conductivity type formed in an epitaxial layer formed on a semiconductor substrate, the well forming the body of the transistor.

4. The closed cell lateral MOS transistor of claim 1, wherein the body region is formed centered in the source cell surrounded by the source region.

5. The closed cell lateral MOS transistor of claim 4, wherein the body region and the source region are formed as overlapping diffusion regions.

6. The closed cell lateral MOS transistor of claim 1, wherein the mesh formed by the conductive gate has minimum polysilicon-to-polysilicon spacing.

7. The closed cell lateral MOS transistor of claim 1, wherein the conductive gate forms a mesh having a plurality of substantially identically sized openings.

8. The closed cell lateral MOS transistor of claim 1, wherein the contact opening in each of the source cells comprises a stripe contact having an elongated shape, wherein two narrow ends of the stripe contact overlap the sidewall spacers formed on the sidewalls of the conductive gate surrounding the respective source cell to expose the lower portion of the sidewall spacers.

9. The closed cell lateral MOS transistor of claim 1, wherein the contact opening in each of the source cells comprises a contact having a cross shape, wherein at least four ends of the cross-shaped contact opening overlap the sidewall spacers formed on the sidewalls of the conductive gate surrounding the respective source cell to expose the lower portion of the sidewall spacers.

10. The closed cell lateral MOS transistor of claim 1, wherein the source/body contact in each of the source cells comprises a tungsten plug contact.

11. The closed cell lateral MOS transistor of claim 1, wherein the first conductivity type is P-type conductivity and the second conductivity type is N-type conductivity.

* * * * *